United States Patent
Kim

(10) Patent No.: US 7,358,128 B2
(45) Date of Patent: Apr. 15, 2008

(54) METHOD FOR MANUFACTURING A TRANSISTOR

(75) Inventor: Jea Hee Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 93 days.

(21) Appl. No.: 11/121,499

(22) Filed: May 3, 2005

(65) Prior Publication Data
US 2005/0260817 A1 Nov. 24, 2005

(30) Foreign Application Priority Data
May 3, 2004 (KR) .................. 10-2004-0031070

(51) Int. Cl.
*H01L 21/8238* (2006.01)
(52) U.S. Cl. .............. 438/199; 438/303; 257/E21.626; 257/E21.64
(58) Field of Classification Search ........... 438/197, 438/199, 301, 303, 900; 257/E21.626, E21.632, 257/E21.64, 900
See application file for complete search history.

(56) References Cited

U.S. PATENT DOCUMENTS 6,607,951 B2 * 8/2003 Chen et al. ............. 438/199
2005/0079677 A1 * 4/2005 Ke et al. ................ 438/296
2005/0110091 A1 * 5/2005 Yamazaki et al. .......... 257/347
2005/0136606 A1 * 6/2005 Rulke et al. ............. 438/305
2006/0014377 A1 * 1/2006 Kim ..................... 438/623
2006/0244074 A1 * 11/2006 Chen et al. .............. 257/371

OTHER PUBLICATIONS

Stan Gibilisco; The Illustrated Dictionary of Electronics; 2001; p. 493; Eighth Edition; McGraw-Hill; New York, New York.
Stanley Wolf Ph.D. and Richard N. Tauber Ph.D.; Silicon Processing for the VLSI Era vol. 1: Process Technology; 2000; p. 202-204, 296; Second Edition; Lattice Press; Sunset Beach, California.

* cited by examiner

*Primary Examiner*—Hoai v Pham
(74) *Attorney, Agent, or Firm*—Andrew D. Fortney

(57) ABSTRACT

A semiconductor device and a method for manufacturing the same is disclosed, in which a spacer containing nitrogen therein has a tensile stress and enables device reliability improvement by improving the On-current without regard to the kind of transistor. The semiconductor device includes a semiconductor substrate; a gate insulating layer and a gate electrode on the semiconductor substrate; spacers at sidewalls of the gate electrode, wherein the spacer contains nitrogen to obtain or increase its tensile stress; and source and drain regions in the semiconductor substrate adjacent to the gate electrode.

20 Claims, 6 Drawing Sheets

METHOD FOR MANUFACTURING A TRANSISTOR

CROSS-REFERENCE TO RELATED APPLICATIONS

This application claims the benefit of Korean Application No. P2004-31070, filed on May 3, 2004, which is hereby incorporated by reference as if fully set forth herein.

BACKGROUND OF THE INVENTION

1. Field of the Invention

The present invention relates to a semiconductor device, and more particularly, to a transistor and a method for manufacturing the same, that provides a tensile stress by forming a gate spacer of containing nitrogen.

2. Discussion of the Related Art

A method for manufacturing a transistor according to the related art will be described as follows.

FIG. 1A to FIG. 1E are cross sectional views for explaining a method of forming a transistor in a semiconductor device according to the related art.

As shown in FIG. 1A, a device isolation layer 12 is formed in a device isolation region of a semiconductor substrate 11. The device isolation layer 12 is a Shallow Trench Isolation (STI) structure. Subsequently, n-type and p-type wells (not shown) are formed in active regions of the substrate 11, according to the channel type of the transistor. In order to control a threshold voltage of the transistor, p-type and n-type impurity ions are selectively implanted in a channel ion implantation process, whereby a channel ion implant layer (not shown) is formed at a predetermined depth of the well. After forming the n-type well, the p-type well, and the channel ion implantation layer, a thermal process is performed to activate the implanted impurity ions.

After that, an oxide layer 13a and a polysilicon layer 14a are sequentially formed on the semiconductor substrate 11. With increasing integration of the device, the thickness of the oxide layer 13a generally decreases. A thin oxide layer 13a may generate, increase or result in a leakage current. In order to reduce or prevent the leakage current, nitrogen may be injected to the oxide layer 13a, thereby decreasing the electrical thickness and increasing the physical thickness.

As shown in FIG. 1B, the oxide layer 13a and the polysilicon layer 14a are patterned by an etch process using a gate mask, thereby forming a gate oxide layer 13 and a gate electrode 14. Then, in order to prevent the increase of a depletion layer in source and drain regions, a pocket region 15 is formed in a pocket ion implantation process. The pocket region 15 may be formed in a tilt-ion implantation process using the gate electrode 14 as a mask.

Before performing the pocket ion implantation process, a buffer oxide layer (not shown) having a uniform thickness is formed on the semiconductor substrate 11 having the gate electrode 14 by a thermal oxidation process, thereby preventing or reducing damage to the transistor due to the ion implantation. Next, a relatively low dose or concentration of impurity ions are implanted into the semiconductor substrate 11 using the gate electrode 14 as a mask, thereby forming lightly-doped (LDD) regions 16a in the semiconductor substrate 11 adjacent to gate 14 (e.g., at both sides of the gate electrode 14 as shown).

As shown in FIG. 1C, an insulating layer of TEOS (tetraethyl orthosilicate)-based glass is formed on an entire surface of the semiconductor substrate 11, including the gate electrode 14, at a predetermined thickness, thereby forming a buffer layer 17. Thereon, a silicon nitride layer 18 and a TEOS oxide layer 19 are sequentially formed (e.g., for subsequent formation of a double spacer). At this time, the buffer layer 17 may have a thickness of 200 Å, the silicon nitride layer 18 may have a thickness of 200 Å, and the TEOS oxide layer 19 may have a thickness of 800 Å. Or, the buffer layer 17 may have a thickness of 100 Å, the silicon nitride layer 18 may have a thickness of 100 Å, and the TEOS oxide layer 19 may have a thickness of 800 Å.

Referring to FIG. 1D, spacers 21 and 22 (including layers 17, 18 and 19) are formed at sidewalls of the gate electrode 14 by anisotropically etching the TEOS oxide layer 19, the silicon nitride layer 18 and the buffer layer 17. Then, a relatively high dose or concentration of impurity ions are implanted into the semiconductor substrate using the gate electrode 14 and the spacers 21 and 22 as a mask, thereby forming highly-doped ion implantation layers 16b adjacent to the spacers 21 and 22. Then, a thermal process is performed thereto, thereby activating the implanted impurity ions. Accordingly, it is possible to form source and drain regions 16 comprised of the LDD regions 16a and the highly-doped ion implantation layers 16b.

As shown in FIG. 1E, in order to lower a contact resistance, a silicide layer 20 is formed on the gate electrode 14 and the source and drain regions 16, thereby forming the transistor.

However, the method for manufacturing the transistor according to the related art has some disadvantages. In order to prevent or reduce the leakage current, nitrogen may be injected into the gate oxide layer. As the density of nitrogen increases, it is advantageous to a PMOS transistor. However, an increase in the density of nitrogen is disadvantageous to an NMOS transistor since the mobility of electrons moving from the source region to the drain region decreases. On the other hand, the electron, which is the carrier of the NMOS transistor, has great mobility under tensile stress.

Also, the silicon nitride layer in the spacer has a tensile stress of about $10^{10}$ dynes/cm$^2$, but the TEOS oxide layer scarcely has any tensile stress. However, in the entire spacer, since the TEOS oxide layer is the main part, the spacer has at most a small tensile stress, so that it may be difficult to improve the On-current (also known as "on-state current") or carrier mobility.

However, since silicon nitride has a relatively high tensile stress, it is possible to improve the tensile stress in the spacer by forming a thin silicon nitride layer. However, it may be impossible to form a thin silicon nitride layer under some conditions, since a thin silicon nitride layer may generate other problems.

SUMMARY OF THE INVENTION

Accordingly, the present invention is directed to a semiconductor device and a method for manufacturing the same that substantially obviates one or more problems due to limitations and disadvantages of the related art.

An object of the present invention is to provide a semiconductor device and a method for manufacturing the same, in which a spacer containing nitrogen therein has a tensile stress, so that it is possible to improve reliability by improving On-current (on-state current) or carrier mobility, without regard to the kind of transistor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a semiconductor substrate; a gate insulating layer and a gate electrode on the semiconductor substrate; a spacer at a sidewall of the gate electrode, wherein the spacer contains nitrogen to obtain a tensile stress; and source and drain regions in the semiconductor substrate adjacent to the gate electrode (e.g., at both sides of the gate electrode). In one embodiment, the spacer comprises first and second insulating layers, at least one of the first and second insulating layers containing nitrogen therein.

In another aspect, a method for manufacturing a semiconductor device includes forming a gate electrode on a semiconductor substrate; forming a first insulating layer on the semiconductor substrate including the gate electrode; forming a second insulating layer on the first insulating layer, wherein the second insulating layer contains nitrogen therein and has a tensile stress; and forming spacers at sidewalls of the gate electrode by anisotropically etching the first and second insulating layers. In one embodiment, the method further includes forming LDD regions in the semiconductor substrate adjacent to the gate electrode (e.g., using the gate as a mask); and forming source and drain regions adjacent to the spacers by implanting impurity ions into the substrate using the gate electrode and the spacers as a mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a method for manufacturing the same according to the present invention will be described with reference to the accompanying drawings.

FIG. 2A to FIG. 2F are cross sectional views for explaining a method of forming a semiconductor device according to the present invention.

Figure 1A:
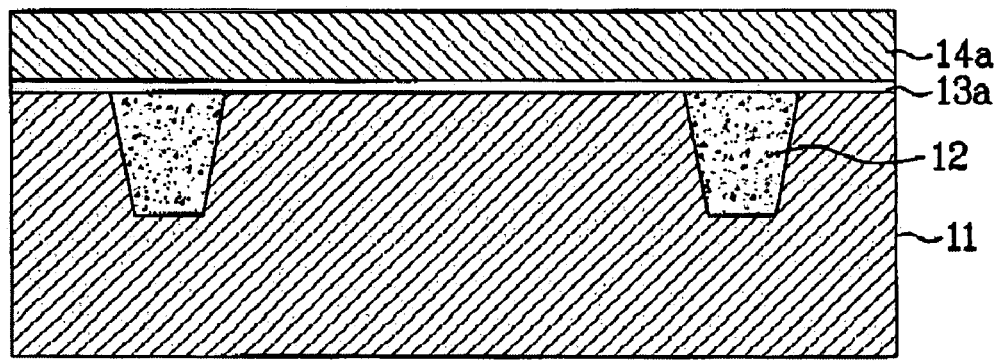
FIG. 1A to FIG. 1E are cross sectional views for explaining a method of forming a semiconductor device according to the related art.
Figure 1B:
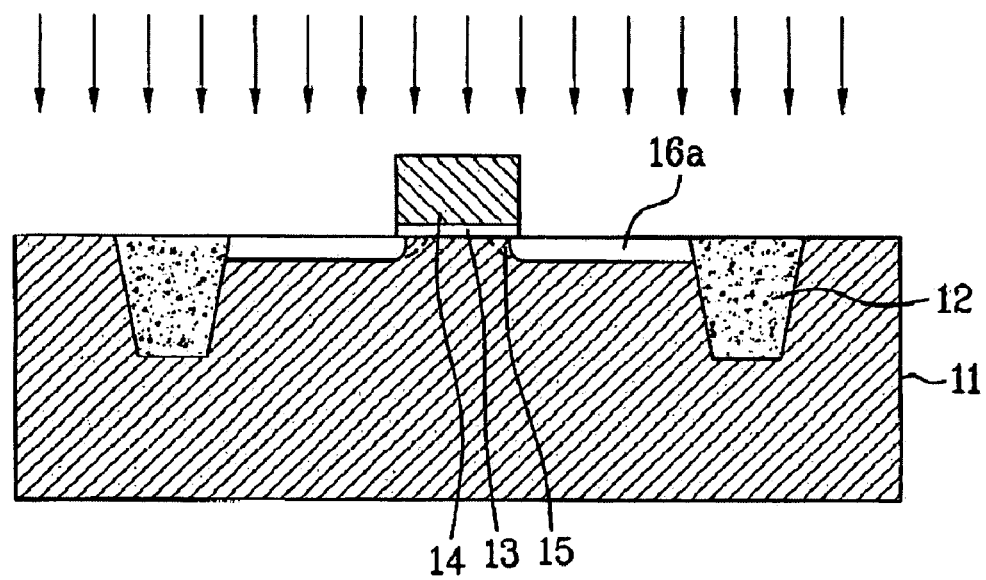
Figure 1C:
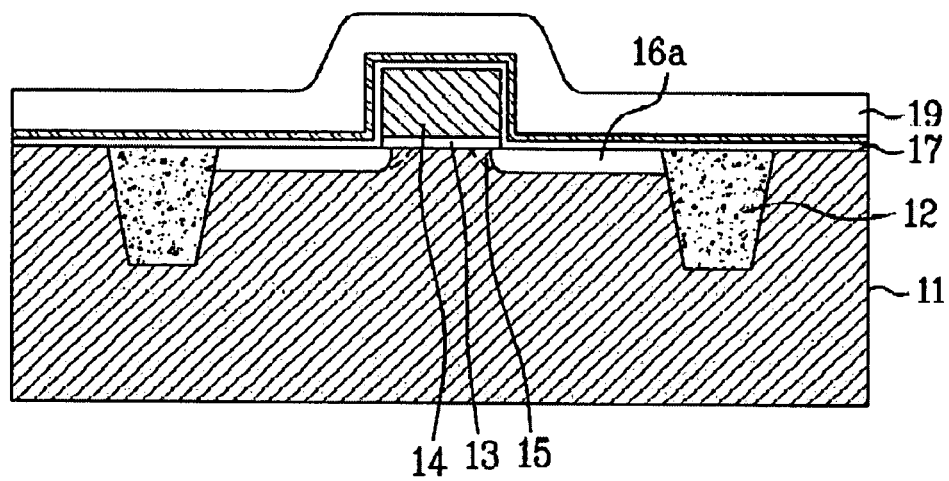
Figure 1D:
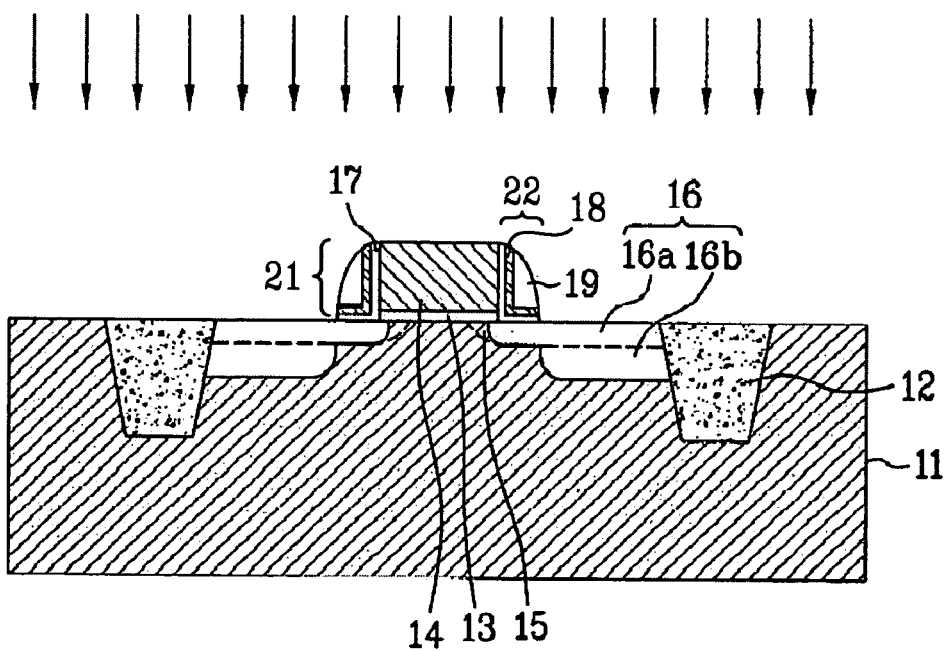
Figure 1E:
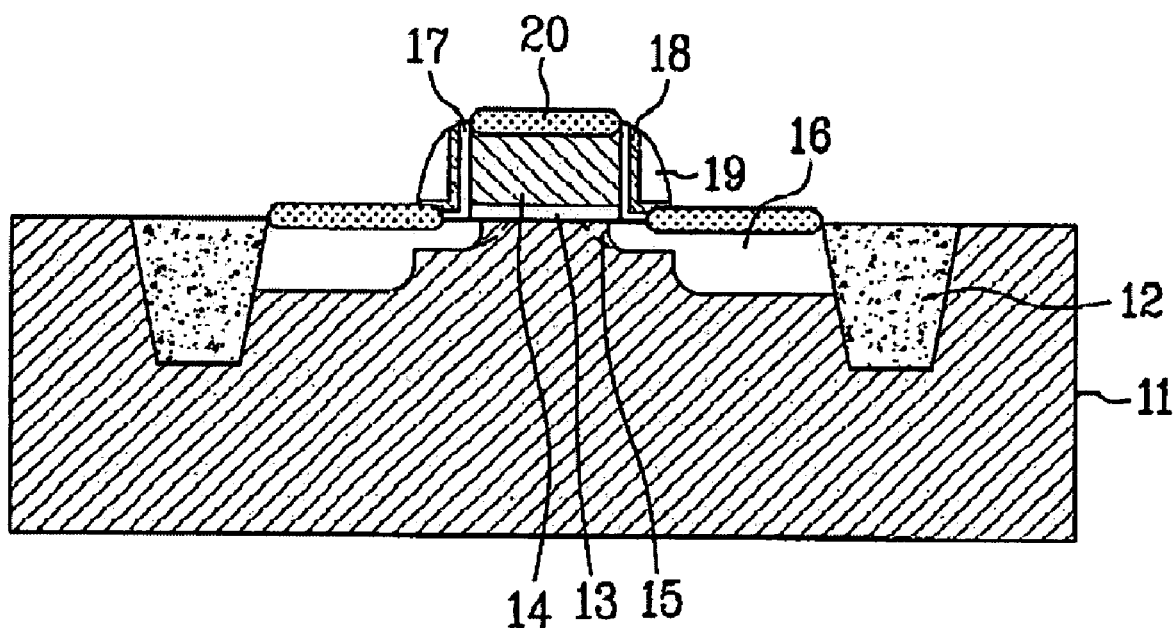
Figure 2A:
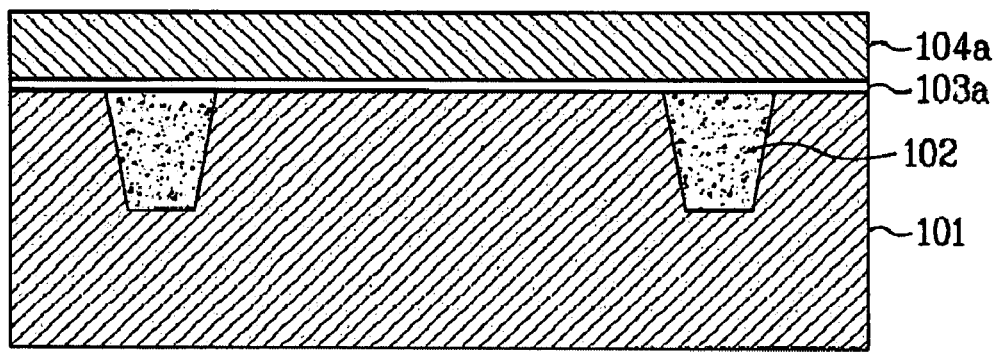
FIG. 2A to FIG. 2F are cross sectional views for explaining a method of forming a semiconductor device according to the present invention.

As shown in FIG. 2A, a device isolation layer 102 is formed in a device isolation region of a semiconductor substrate 101. The device isolation layer 102 may comprise an STI structure. Subsequently, n-type and p-type wells (not shown) may be formed in active regions of the substrate 101 according to the transistor channel type. To control a threshold voltage of the transistor, p-type and n-type impurity ions may be selectively implanted in a channel ion implantation process, whereby a channel ion implant layer (not shown) can be formed at a predetermined depth in the well. After forming the n-type well, the p-type well, and the channel ion implant layer, a thermal process (e.g., annealing, or "drive-in") is performed to activate the implanted impurity ions. After that, an oxide layer 103a and a polysilicon layer 104a are sequentially formed on the semiconductor substrate 101. A thin oxide layer 103a may be formed by thermal growth, which may be either wet (e.g., using oxygen and hydrogen gas) or dry (using only oxygen gas, optionally with an inert or noble gas) at a temperature between 800° C. and 900° C.

Figure 2B:
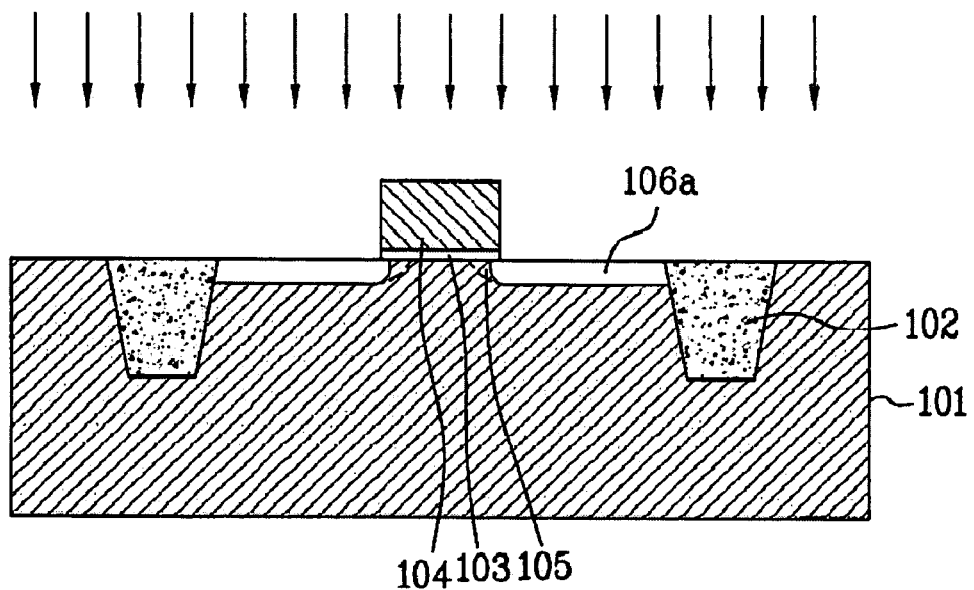

As shown in FIG. 2B, the oxide layer 103a and the polysilicon layer 104a are patterned by an etch process using a gate mask, thereby forming a gate oxide layer 103 and a gate electrode 104. Then, in order to reduce, inhibit or prevent any increase in a depletion layer in source and drain regions, a pocket region 105 may be formed in a pocket ion implantation process. For example, the pocket region 105 may be formed in a tilt-ion implantation process using the gate electrode 104 as a mask. Before performing the pocket ion implantation process, a buffer oxide layer (not shown) having a uniform thickness may be formed on the semiconductor substrate 101 (having the gate electrode 104 thereon) by thermal oxidation, thereby reducing or preventing damage to the transistor due to the ion implantation.

Next, a relatively low dose or concentrations of relatively low energy impurity ions are implanted into the semiconductor substrate 101 using the gate electrode 104 as a mask, thereby forming lightly-doped (LDD) regions 106a adjacent to the gate electrode 104 in the semiconductor substrate 101.

Figure 2C:
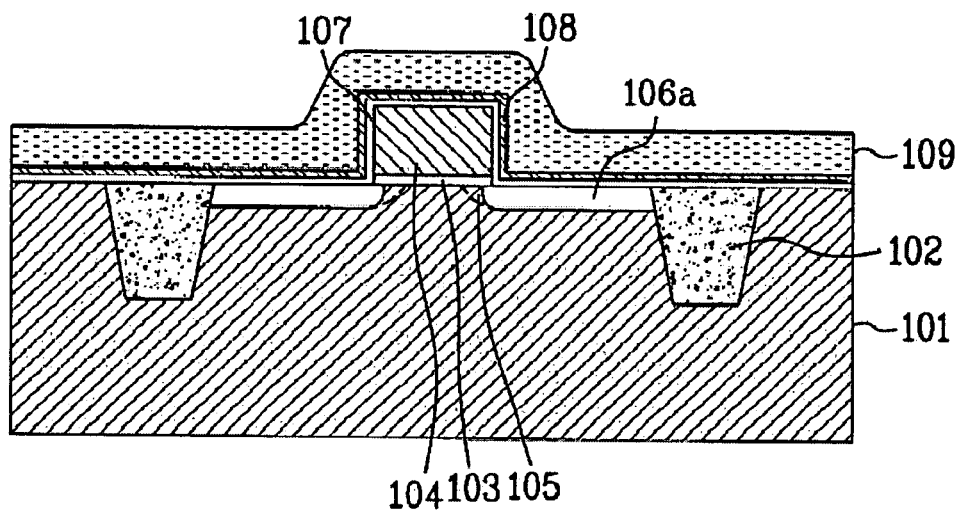
Figure 2D:
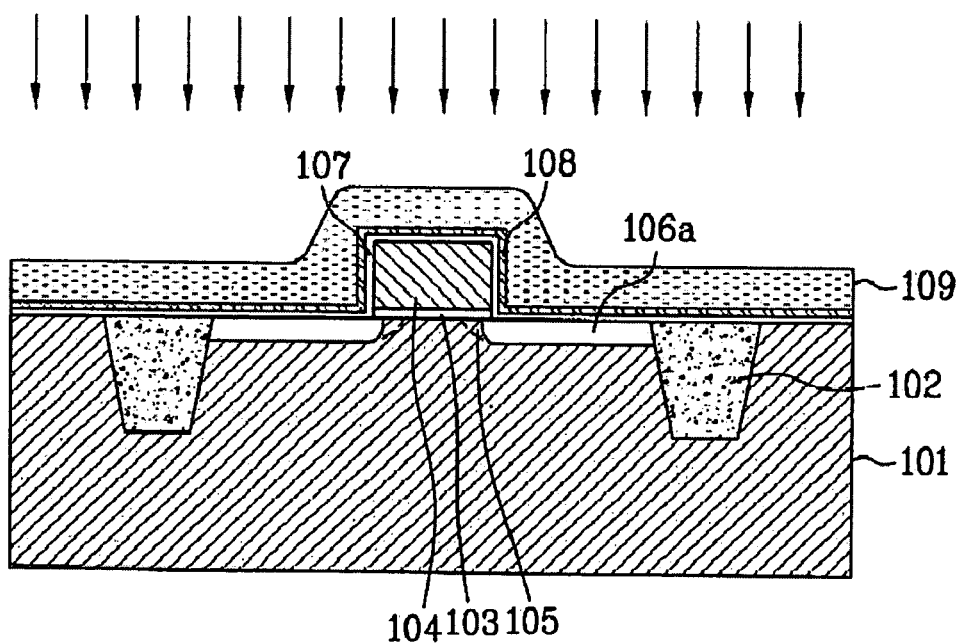

Referring to FIG. 2C and FIG. 2D, an insulating material (e.g., a TEOS-based oxide) is deposited on the entire surface of the semiconductor substrate 101, including the gate electrode 104, at a predetermined thickness, thereby forming a buffer layer 107. Then, a silicon nitride layer 108 and a TEOS oxide layer 109 are sequentially formed on the buffer layer 107, for formation of a (double) spacer. The buffer layer 107 may have a thickness of from 50 Å to 300 Å (e.g., between 100 Å to 200 Å). Also, the silicon nitride layer 108 may have a thickness of from 50 Å to 300 Å (e.g., between 100 Å and 200 Å), and the TEOS oxide layer 109 may have a thickness of from 200 Å to 1500 Å (e.g., between 500 Å and 1000 Å). Also, since the TEOS layer 109 contains nitrogen therein, the TEOS layer 109 has a tensile stress. Generally, TEOS layer 109 contains sufficient nitrogen to increase the tensile stress and/or on-state current (particularly of an NMOS transistor containing layer 109) relative to an otherwise identical transistor in which the TEOS layer 109 contains no intentionally added nitrogen (e.g., layer 19 of FIG. 1). For example, TEOS layer 109 may contain nitrogen in an amount of nitrogen sufficient to provide the layer with a tensile stress of between $10^9$ and $10^{10}$ dynes/cm$^2$, or an on-current improvement of at least 5% relative to an otherwise identical transistor without nitrogen in the spacer oxide layer.

That is, as shown in FIG. 2C, when depositing the TEOS oxide layer 109 (e.g., by low pressure chemical vapor deposition, or LPCVD), a nitrogen source gas such as ammonia is provided to the deposition chamber, whereby nitrogen is introduced into the subsequently formed silicon oxide (typically, $SiO_2$). Alternatively, other nitrogen source gases may be used, such as hydrazine (N$_2$H$_4$), nitrogen oxides (e.g., N$_2$O, NO, N$_2$O$_3$), hydroxylamine (NH$_2$OH), etc. Thus, the introduction of a nitrogen source gas may result in the formation of a silicon oxynitride (SiO$_x$N$_y$, where 0<x<2 and 0<y<4/3).

In another method, as shown in FIG. 2D, after depositing the TEOS oxide layer 109, nitrogen may be introduced into the TEOS oxide layer 109 by ion implantation. Thereafter, a thermal process may be performed at a temperature of 700° C. to 800° C. for 8 to 12 seconds (e.g., in a Rapid Thermal Annealing, or RTA, apparatus), thereby activating the nitrogen. Preferably, the thermal process is performed at a temperature of 750° C. for 10 seconds.

Figure 2E:
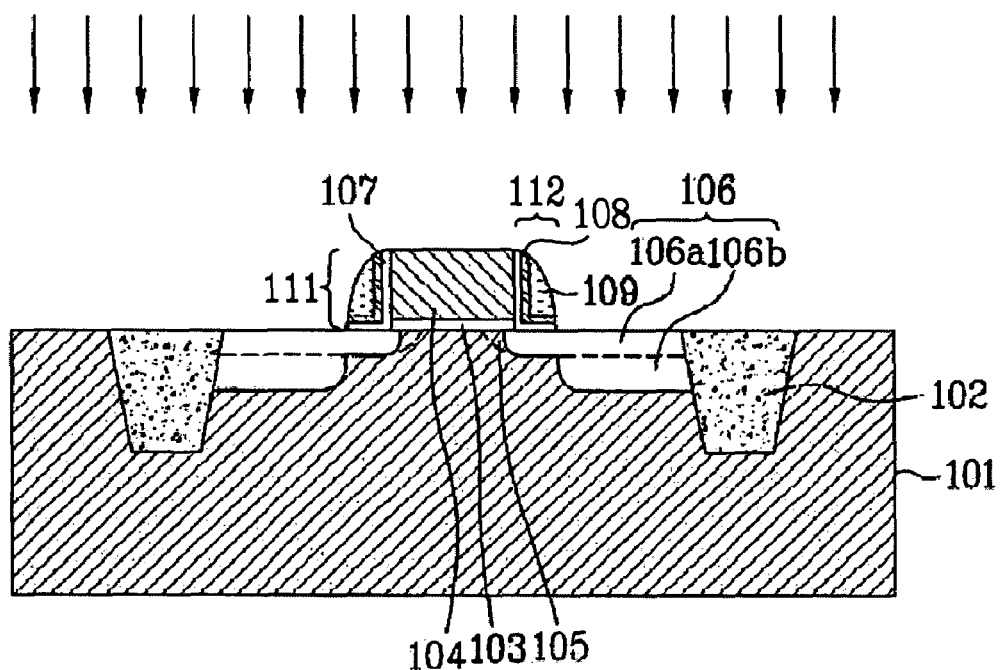

As shown in FIG. 2E, spacers 111 and 112 (comprising layers 107, 108 and 109) are formed at sidewalls of the gate electrode 104 by anisotropically etching the nitrogen-containing TEOS oxide layer 109, the silicon nitride layer 108 and the buffer layer 107. Then, a relatively high dose or concentration of relatively high energy impurity ions are implanted to the semiconductor substrate using the gate electrode 104 and the spacers 111 and 112 as a mask, thereby forming highly-doped ion implant layers 106*b* adjacent to the spacers 111 and 112 in the semiconductor substrate 101. Then, a thermal process is performed thereto, thereby activating the implanted impurity ions. Accordingly, it is possible to form source and drain regions 106 comprising the LDD regions 106*a* and the highly-doped ion implantation layers 106*b*.

Figure 2F:
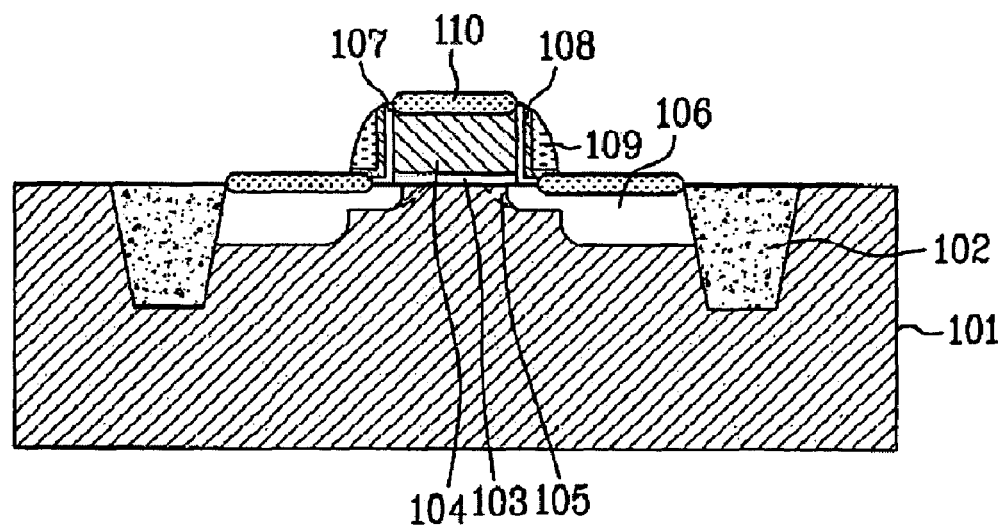

Referring to FIG. 2F, a silicide layer 110 is formed on the gate electrode 104 and the source and drain regions 106, to lower a contact resistance. In order to form the silicide layer 110, a refractory metal such as cobalt, titanium or tungsten is deposited on the entire surface of the semiconductor substrate, and then a primary thermal process is performed to form a silicide layer at the interface between the refractory metal and the silicon layer. Then, after removing the unreacted refractory metal, a secondary thermal process may be performed.

As mentioned above, the semiconductor device and the method for manufacturing the same according to the present invention has certain advantages. For example, the spacer generally contains additional nitrogen therein, providing the spacer with a tensile stress sufficient to improve the On-current of a transistor by about 20% without regard to the kind of transistor, thereby improving the reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a semiconductor device comprising:
   forming a gate electrode on a semiconductor substrate;
   forming a first insulating layer on the semiconductor substrate including the gate electrode;
   forming a second insulating layer on the first insulating layer by introducing TEOS and a nitrogen source gas into a low pressure chemical vapor deposition chamber, wherein the second insulating layer contains nitrogen therein and has a tensile stress; and
   forming spacers at sidewalls of the gate electrode by anisotropically etching the first and second insulating layers.

2. The method of claim 1, further comprising forming a buffer layer on the semiconductor substrate before forming the first insulating layer.

3. The method of claim 2, wherein the buffer layer has a thickness between 100 Å and 200 Å, the first insulating layer has a thickness between 100 Å and 200 Å, and the second insulating layer has a thickness between 500 Å and 1000 Å.

4. The method of claim 1, further comprising:
   forming lightly doped regions in the semiconductor substrate, adjacent to the gate electrode; and
   forming source and drain regions adjacent to the spacers by implanting a high dose or concentration of impurity ions into the substrate, using the gate electrode and the spacers as a mask.

5. The method of claim 4, further comprising forming a suicide layer on the gate electrode, the source region and the drain region.

6. A method for manufacturing a semiconductor device comprising:
   forming a buffer oxide layer on a semiconductor substrate before forming a first insulating layer;
   forming the first insulating layer on the semiconductor substrate and a gate electrode, wherein the first insulating layer comprises silicon nitride;
   forming a second insulating layer on the first insulating layer, wherein the second insulating layer contains sufficient nitrogen to increase a tensile stress and improve an on-current of the semiconductor device, and wherein the second insulating layer comprises an oxynitride; and
   forming spacers at sidewalls of the gate electrode by anisotropically etching the first and second insulating layers.

7. The method of claim 6, wherein the step of forming the second insulating layer includes:
   depositing an insulating material on the first insulating layer;
   implanting nitrogen ions to the insulating material; and
   performing a thermal process to activate the nitrogen ions.

8. The method of claim 7, wherein the thermal process is performed at a temperature between 700° C. and 800° C. for 8 to 12 seconds in a rapid thermal anneal (RTA) apparatus.

9. The method of claim 6, wherein the second insulating layer comprises a TEOS oxide layer.

10. The method of claim 6, wherein the buffer layer has a thickness between 100 Å and 200 Å and the first insulating layer has a thickness between 100 Å and 200 Å.

11. The method of claim 10, wherein the second insulating layer has a thickness between 500 Å and 1000 Å.

12. The method of claim 6, wherein the step of forming the second insulating layer comprises introducing TEOS into a low pressure chemical vapor deposition chamber.

13. The method of claim 6, further comprising:
   forming lightly doped regions in the semiconductor substrate, adjacent to the gate electrode; and
   forming source and drain regions adjacent to the spacers by implanting a high dose or concentration of impurity ions into the substrate, using the gate electrode and the spacers as a mask.

14. The method of claim 13, further comprising forming a silicide layer on the gate electrode, the source region and the drain region.

15. A method for manufacturing a semiconductor device comprising:
   forming a gate electrode on a semiconductor substrate;
   forming a first insulating layer on the semiconductor substrate including the gate electrode;

forming a second insulating layer on the first insulating layer, wherein the second insulating layer contains nitrogen therein, has a tensile stress, and comprises a TEOS oxide layer; and forming spacers at sidewalk of the gate electrode by anisotropically etching the first and second insulating layers.

16. The method of claim 15, further comprising forming a buffer layer on the semiconductor substrate before forming the first insulating layer.

17. The method of claim 16, wherein the buffer layer has a thickness between 100 Å and 200 Å, the first insulating layer has a thickness between 100 Å and 200 Å, and the second insulating layer has a thickness between 500 Å and 1000 Å.

18. The method of claim 15, wherein the step of forming the second insulating layer comprises introducing TEOS and a nitrogen source gas into a low pressure chemical vapor deposition chamber.

19. The method of claim 15, wherein the step of forming the second insulating layer includes:

implanting nitrogen ions to the TEOS oxide; and performing a thermal process to activate the nitrogen ions.

20. The method of claim 19, wherein the thermal process is performed at a temperature between 700° C. and 800° C. for 8 to 12 seconds in a rapid thermal anneal (RTA) apparatus.

* * * * *